(12) United States Patent
Kim et al.

(10) Patent No.: US 12,178,104 B2
(45) Date of Patent: *Dec. 24, 2024

(54) ORGANIC LIGHT EMITTING DISPLAY APPARATUS

(71) Applicant: LG Display Co., Ltd., Seoul (KR)

(72) Inventors: Taemin Kim, Paju-si (KR); Kyunghoon Han, Seoul (KR); Wonhoe Koo, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/384,196

(22) Filed: Oct. 26, 2023

(65) Prior Publication Data
US 2024/0057432 A1    Feb. 15, 2024

Related U.S. Application Data

(63) Continuation of application No. 17/113,900, filed on Dec. 7, 2020, now Pat. No. 11,839,125.

(30) Foreign Application Priority Data

Dec. 31, 2019   (KR) .................. 10-2019-0179607

(51) Int. Cl.
| | |
|---|---|
| H10K 59/35 | (2023.01) |
| H10K 50/84 | (2023.01) |
| H10K 50/85 | (2023.01) |
| H10K 59/32 | (2023.01) |
| H10K 59/38 | (2023.01) |
| H10K 102/00 | (2023.01) |

(52) U.S. Cl.
CPC .......... *H10K 59/353* (2023.02); *H10K 50/84* (2023.02); *H10K 50/85* (2023.02); *H10K 59/351* (2023.02); *H10K 59/352* (2023.02); *H10K 59/32* (2023.02); *H10K 59/38* (2023.02); *H10K 2102/351* (2023.02)

(58) Field of Classification Search
CPC .......... H10K 50/85–858; H10K 59/32; H10K 59/351; H10K 59/38; H10K 59/875–879
See application file for complete search history.

(56) References Cited

U.S. PATENT DOCUMENTS 11,839,125 B2 * 12/2023 Kim ................. H10K 59/351
2020/0350516 A1   11/2020 An et al.

FOREIGN PATENT DOCUMENTS

| CN | 107833975 A | 3/2018 |
|---|---|---|
| CN | 109218418 A | 1/2019 |

(Continued)

*Primary Examiner* — Daniel P Shook
(74) *Attorney, Agent, or Firm* — Birch, Stewart, Kolasch & Birch, LLP

(57) ABSTRACT

An organic light emitting display apparatus includes a substrate including a plurality of pixels having a plurality of sub-pixels, a plurality of organic light emitting elements disposed at the plurality of sub-pixels, a plurality of light extraction patterns disposed on the plurality of organic light emitting elements and having different size at each of the plurality of sub-pixels, an encapsulation part disposed on the plurality of organic light emitting elements, and a planarization layer configured to planarize an upper portion of the plurality of the encapsulation part. The plurality of light extraction patterns are disposed on the planarization layer.

19 Claims, 9 Drawing Sheets

(56) References Cited

FOREIGN PATENT DOCUMENTS

| | | |
|---|---|---|
| CN | 109346618 A | 2/2019 |
| KR | 10-1468064 B1 | 11/2014 |
| KR | 10-2017-0038951 A | 4/2017 |
| KR | 10-2017-0052455 A | 5/2017 |
| KR | 10-2017-0124012 A | 11/2017 |
| KR | 10-2017-0132018 A | 12/2017 |
| KR | 10-2018-0068239 A | 6/2018 |

\* cited by examiner

ORGANIC LIGHT EMITTING DISPLAY APPARATUS

CROSS-REFERENCE TO RELATED APPLICATIONS

This application is a Continuation Application of U.S. patent application Ser. No. 17/113,900 filed on Dec. 7, 2020 (now U.S. Pat. No. 11,839,125, issued on Dec. 5, 2023), which claims priority to Korean Patent Application No. 10-2019-0179607 filed on Dec. 31, 2019, with the Korean Intellectual Property Office, where the entire contents of all these applications are hereby expressly incorporated by reference into the present application.

BACKGROUND

Field

The present disclosure relates to an organic light emitting display apparatus, and more particularly, to an organic light emitting display apparatus capable of improving front luminance and minimizing a change in color according to a viewing angle.

Discussion of the Related Art

An organic light emitting display apparatus can be manufactured to be light and thin since it does not require a separate light source, unlike a liquid crystal display apparatus having a separate light source. In addition, the organic light emitting display apparatus has advantages in terms of power consumption due to a low voltage driving, and is excellent in terms of a color implementation, a response speed, a viewing angle, and a contrast ratio (CR). Therefore, organic light emitting display apparatuses have been studied as the next generation displays.

Such an organic light emitting display apparatus is a self-light emitting display apparatus. The organic light emitting display apparatus uses an organic light emitting element in which electrons from a cathode for electron injection and holes from an anode for hole injection are injected into a light emitting part to generate an exciton through combination of the electrons and the holes. Light is generated from the organic light emitting element when the exciton is transited from an excited state to a ground state.

Types of these organic light emitting display apparatuses can be classified into a top emission type, a bottom emission type, and a dual emission type according to a direction of light emission, and can also be classified into a passive matrix type and an active matrix type according to a driving method.

SUMMARY OF THE DISCLOSURE

The inventors of the present disclosure have developed an organic light emitting element having a multi-stack structure using a stack of a plurality of light emitting parts to realize improved efficiency and lifespan characteristics of the organic light emitting display apparatus.

In the organic light emitting element having a multi-stack structure, a light emitting area where light emission occurs through recombination of electrons and holes is located in each of the plurality of light emitting parts. Therefore, the organic light emitting element having a multi-stack structure can have high efficiency and be driven with a low current, thereby allowing for an increase in the lifespan of the organic light emitting element.

However, the inventors of the present disclosure have recognized that when light extraction patterns having the same structure are applied to a plurality of sub-pixels emitting light of different colors, a problem may occur in which front luminance in the respective sub-pixels can decrease. For example, optimal light extraction patterns are not applied to the respective sub-pixels that emit light having different light distributions, which can result in a limitation that display quality is degraded.

Accordingly, the inventors of the present disclosure have invented an organic light emitting display apparatus capable of improving front luminance by applying light extraction patterns having different shapes to respective sub-pixels emitting light of different colors.

Accordingly, an aspect of the present disclosure is to provide an organic light emitting display apparatus capable of improving front luminance in respective sub-pixels.

Another aspect of the present disclosure is to provide a light emitting display apparatus driven in dark conditions (e.g., in dark areas/environments) and having improved front luminance.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

According to an embodiment of the present disclosure, an organic light emitting display apparatus comprises a substrate including a plurality of pixels having a plurality of sub-pixels, a plurality of organic light emitting elements at the plurality of sub-pixels, and a plurality of light extraction patterns on the plurality of organic light emitting elements and having different shapes at each of the plurality of sub-pixels.

According to another embodiments of the present disclosure, an organic light emitting display apparatus implemented not to include a polarizing plate, comprises a substrate on which a plurality of sub-pixels are disposed, a plurality of organic light emitting elements on the substrate to correspond to the plurality of sub-pixels, respectively, and a plurality of light extraction patterns disposed to have different aspect ratios in each of the plurality of sub-pixels, wherein the plurality of sub-pixels includes a green sub-pixel, a red sub-pixel and a blue sub-pixel, wherein each of the plurality of organic light emitting elements includes a first electrode, a first light emitting part on the first electrode and including a blue light emitting layer, a second light emitting part on the first light emitting part and including a red light emitting layer and two yellow-green light emitting layers, a third light emitting part on the second light emitting part and including a blue light emitting layer, and a second electrode on the third light emitting part.

Other devices, systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

According to an embodiment of the present disclosure, front luminance of an organic light emitting display apparatus can be improved by disposing light extraction patterns having different structures for respective sub-pixels.

According to an embodiment of the present disclosure, luminance of an organic light emitting display apparatus driven in dark conditions can be improved by disposing light extraction patterns in respective sub-pixels.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
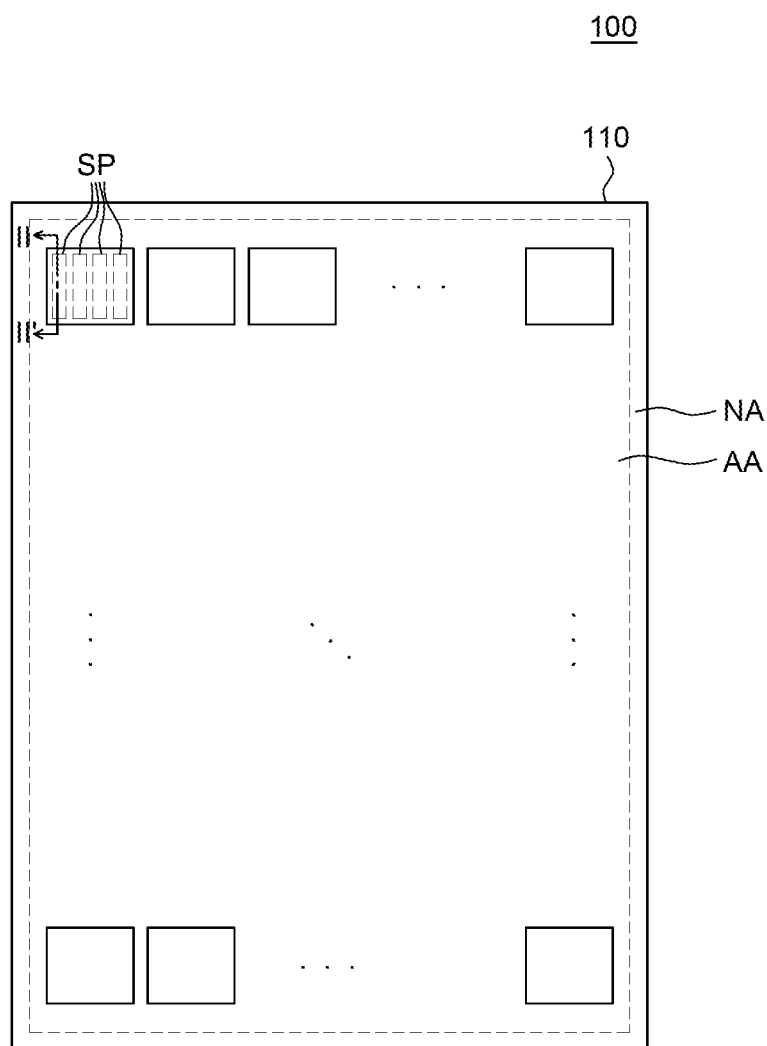
FIG. 1 is a plan view of an organic light emitting display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define any order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to exemplary embodiments of the present disclosure will be described in detail with reference to accompanying drawings.

Figure 2:
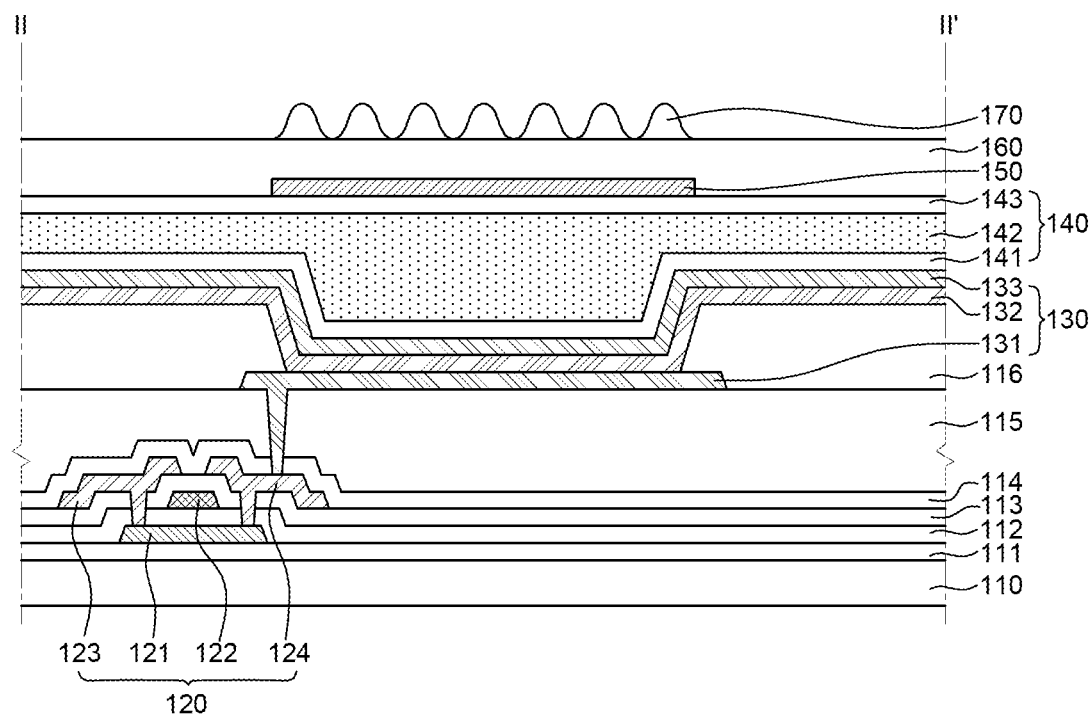
FIG. 2 is a cross-sectional view of the organic light emitting display apparatus, taken along line II-II' of FIG. 1.

FIG. 1 is a plan view of an organic light emitting display apparatus according to an exemplary embodiment of the present disclosure. FIG. 2 is a cross-sectional view of the organic light emitting display apparatus, taken along line II-II' of FIG. 1. All the components of the organic light emitting display apparatus according to all embodiments of the present disclosure are operatively coupled and configured.

With reference to FIGS. 1 and 2, an organic light emitting display apparatus 100 according to an exemplary embodiment of the present disclosure includes a substrate 110, a transistor 120, an organic light emitting element 130, an encapsulation part 140, and a light extraction pattern 170. The organic light emitting display apparatus 100 according to an exemplary embodiment of the present disclosure can be an organic light emitting display apparatus 100 which can be applied to a cinema screen or virtual reality (VR) device driven under dark conditions (e.g., in dark areas/environments). Accordingly, hereinafter, the organic light emitting display apparatus 100 according to an exemplary embodiment of the present disclosure is described as not including a polarizing plate for preventing reflection of external light.

The substrate 110 is a substrate for supporting and protecting various components of the organic light emitting display apparatus 100. The substrate 110 can be formed of glass or a plastic material having flexibility. When the substrate 110 is formed of a plastic material, for example, it can be formed of polyimide. However, embodiments of the present disclosure are not limited thereto.

With reference to FIG. 1, the substrate 110 of the organic light emitting display apparatus 100 includes a display area AA and a non-display area NA.

The display area AA is an area where an image is displayed in the organic light emitting display apparatus 100. In the display area AA, a display element and a variety of driving elements for driving the display element can be disposed. For example, the display element can be configured to include the organic light emitting element 130 including a first electrode 131, a light emitting part 132 and a second electrode 133. In addition, various driving elements for driving the display element, such as a transistor, a capacitor or wirings, can be disposed in the display area AA.

The display area AA can include a plurality of pixels PX. The pixel PX is a minimum unit for configuring a screen, and each of the plurality of pixels PX can include the organic light emitting element 130 and a driving circuit. In addition, each of the plurality of pixels PX can include a plurality of sub-pixels SP that emit light of different wavelengths. For example, the plurality of sub-pixels SP can include a red sub-pixel SP_R, a green sub-pixel SP_G, a blue sub-pixel SP_B, and a white sub-pixel SP_W, or other combinations or variations. This will be described later with reference to FIG. 4.

The non-display area NA is an area where an image is not displayed, and various components for driving the plurality of pixels PX disposed in the display area AA can be disposed. For example, a driver IC which supplies a signal for driving the plurality of pixels PX, a flexible film or the like can be disposed in the non-display area NA.

The non-display area NA can be an area surrounding the display area AA as illustrated in FIG. 1. However, embodiments are not limited thereto. For example, the non-display area NA can be an area extending from the display area AA.

Hereinafter, one sub-pixel SP configuring the plurality of pixels PX disposed in the display area AA of the organic light emitting display apparatus 100 will be described with reference to FIG. 2.

With reference to FIG. 2, a buffer layer 111 is disposed on the substrate 110. The buffer layer 111 can improve adhesion between layers formed on the buffer layer 111 and the substrate 110 and block an alkali component or the like, flowing out from the substrate 110. The buffer layer 111 can be formed of a single layer of silicon nitride (SiNx) or silicon oxide (SiOx) or a multiple layer of silicon nitride (SiNx) or silicon oxide (SiOx), but embodiments of the present disclosure are not limited thereto. The buffer layer 111 can be omitted. For example, the buffer layer 111 can be omitted based on a type and material of the substrate 110 and a structure and type of the transistor 120.

The transistor 120 is disposed on the buffer layer 111 to drive the organic light emitting element 130 of the display area AA. The transistor 120 can be disposed in each of the plurality of pixels PX in the display area AA. The transistor 120 disposed in each of the plurality of pixels PX can be used as a driving element of the organic light emitting display apparatus 100. The transistor 120 includes, for example, a thin film transistor (TFT), an N-channel metal oxide semiconductor (NMOS) transistor, a P-channel metal oxide semiconductor (PMOS) transistor, a complementary metal oxide semiconductor (CMOS) transistor, a field effect transistor (FET) and the like, but embodiments of the present disclosure are not limited thereto. Hereinafter, the transistor 120 will be described assuming that it is a thin film transistor, but embodiments of the present disclosure are not limited thereto.

The transistor 120 includes an active layer 121, a gate electrode 122, a source electrode 123 and a drain electrode 124. The transistor 120 illustrated in FIG. 2 is a driving transistor, and is a thin film transistor having a top gate structure in which the gate electrode 122 is disposed on the active layer 121. However, embodiments of the present disclosure are not limited thereto. For example, the transistor 120 can be implemented as a thin film transistor having a bottom gate structure.

The active layer 121 of the transistor 120 is disposed on the buffer layer 111. The active layer 121 is an area where a channel is formed when the transistor 120 is driven. The active layer 121 can be formed of an oxide semiconductor, amorphous silicon (a-Si), polycrystalline silicon (poly-Si), an organic semiconductor or the like, but embodiments of the present disclosure are not limited thereto.

Agate insulating layer 112 is disposed on the active layer 121. The gate insulating layer 112 can be formed of a single layer of silicon nitride (SiNx) or silicon oxide (SiOx) which is an inorganic material or a multiple layer of silicon nitride (SiNx) or silicon oxide (SiOx). Contact holes are formed in the gate insulating layer 112 so that the source electrode 123 and the drain electrode 124 come into contact with a source region and a drain region of the active layer 121, respectively. As illustrated in FIG. 2, the gate insulating layer 112 can be formed over the entire surface of the substrate 110 or can be patterned to have the same width as the gate electrode 122. However, embodiments of the present disclosure are not limited thereto.

The gate electrode 122 is disposed on the gate insulating layer 112. The gate electrode 122 is disposed on the gate insulating layer 112 to overlap a channel region of the active layer 121. The gate electrode 122 can be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof. However, embodiments of the present disclosure are not limited thereto.

An interlayer insulating layer 113 is disposed on the gate electrode 122. The interlayer insulating layer 113 can be formed of a single layer of silicon nitride (SiNx) or silicon oxide (SiOx) which is an inorganic material or a multiple layer of silicon nitride (SiNx) or silicon oxide (SiOx), but embodiments of the present disclosure are not limited thereto. Contact holes are formed in the interlayer insulating layer 113 so that the source electrode 123 and the drain electrode 124 come into contact with the source region and the drain region of the active layer 121, respectively.

The source electrode 123 and the drain electrode 124 are disposed on the interlayer insulating layer 113. The source electrode 123 and the drain electrode 124 are electrically connected to the active layer 121 through the contact holes of the gate insulating layer 112 and the interlayer insulating layer 113. The source electrode 123 and the drain electrode 124 can be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof.

In FIG. 2, only a driving transistor among various types of transistor 120 included in the organic light emitting display apparatus 100 is illustrated for convenience of description, but other transistors such as a switching transistor and the like can also be disposed.

With reference to FIG. 2, a passivation layer 114 for protecting the transistor 120 is disposed on the transistor 120. A contact hole for exposing the drain electrode 124 of the transistor 120 is formed in the passivation layer 114. FIG. 2 illustrates that the contact hole for exposing the drain electrode 124 is formed in the passivation layer 114, but a contact hole for exposing the source electrode 123 can be formed. The passivation layer 114 can be formed of a single layer of silicon nitride (SiNx) or silicon oxide (SiOx) or a multiple layer of silicon nitride (SiNx) or silicon oxide (SiOx). However, the passivation layer 114 can be omitted.

An overcoating layer 115 for planarizing an upper portion of the transistor 120 is disposed on the passivation layer 114. The contact hole for exposing the drain electrode 124 of the transistor 120 is formed in the overcoating layer 115. FIG. 2 illustrates that the contact hole for exposing the drain electrode 124 is formed in the overcoating layer 115, but a contact hole for exposing the source electrode 123 can be formed therein. The overcoating layer 115 can be formed of any one of acrylic resin, epoxy resin, phenol resin, polyamide resin, polyimide resin, unsaturated polyester resin, polyphenylene resin, polyphenylene sulfide resin, benzocyclobutene, and photoresist, but embodiments of the present disclosure are not limited thereto.

The organic light emitting element 130 is disposed on the overcoating layer 115. The organic light emitting element 130 includes the first electrode 131 formed on the overcoating layer 115 and electrically connected to the drain electrode 124 of the transistor 120, the light emitting part 132 disposed on the first electrode 131, and the second electrode 133 formed on the light emitting part 132. Here, the first electrode 131 can be an anode electrode, and the second electrode 133 can be a cathode electrode.

The first electrode 131 is disposed on the overcoating layer 115 and is electrically connected to the drain electrode 124 through the contact holes formed in the passivation layer 114 and the overcoating layer 115. And, the first electrode 131 can be formed of a transparent conductive material having a high work function to supply holes to the light emitting part 132. For example, the first electrode 131 can be formed of a transparent conductive oxide such as indium tin oxide (ITO), indium zinc oxide (IZO), indium tin zinc oxide (ITZO), zinc oxide (ZnO), and tin oxide (TO), but embodiments of the present disclosure are not limited thereto.

In FIG. 2, although the first electrode 131 is illustrated as being electrically connected to the drain electrode 124 of the transistor 120 through the contact hole, the first electrode 131 can be configured to be electrically connected to the source electrode 123 of the transistor 120 through the contact hole according to a type of the transistor 120, a design method of a driving circuit, and the like.

A bank 116 is disposed on the first electrode 131 and the overcoating layer 115. The bank 116 can cover an edge of the first electrode 131 of the organic light emitting element 130 to define a light emitting area. The bank 116 is disposed at a boundary between the pixels adjacent to each other to reduce color mixing of light emitted from the organic light emitting elements 130 of each of the plurality of pixels. The bank 116 can be formed of an organic material. For example, the bank 116 can be formed of polyimide resin, acrylic resin, or benzocyclobutene resin, but embodiments of the present disclosure are not limited thereto.

The light emitting part 132 is disposed on the first electrode 131. The light emitting part 132 can be a white light emitting part that emits white light. A color of the white light emitted from the light emitting part 132 can be converted to any one of red, green, and blue by the color filter 150. In addition, the light emitting part 132 can further include various layers such as a hole transporting layer, a hole injection layer, a hole blocking layer, an electron injection layer, an electron blocking layer, and an electron transporting layer. This will be described later with reference to FIG. 3.

The second electrode 133 is disposed on the light emitting part 132. The second electrode 133 supplies electrons to the light emitting part 132. The second electrode 133 can be formed of a conductive material having a low work function. For example, the second electrode 133 can be formed of any one or more among an opaque conductive metal such as magnesium (Mg), silver (Ag), aluminum (Al), calcium (Ca) or the like, and alloys thereof. However, embodiments of the present disclosure are not limited thereto.

With reference to FIG. 2, the encapsulation part 140 is disposed on the organic light emitting element 130. For example, the encapsulation part 140 is disposed on the second electrode 133 to cover the organic light emitting element 130. The encapsulation part 140 protects the organic light emitting element 130 from moisture penetrating from the outside of the organic light emitting display apparatus 100. The encapsulation part 140 includes a first encapsulation layer 141, a foreign material covering layer 142, and a second encapsulation layer 143.

The first encapsulation layer 141 is disposed on the second electrode 133 to inhibit or prevent the penetration of moisture or oxygen. The first encapsulation layer 141 can be formed of an inorganic material such as silicon nitride (SiNx), silicon oxynitride (SiNxOy), or aluminum oxide (AlyOz) or the like, but embodiments are not limited thereto.

The foreign material covering layer 142 is disposed on the first encapsulation layer 141 to planarize a surface thereof. In addition, the foreign material covering layer 142 can cover foreign materials or particles that can occur in a manufacturing process. The foreign material covering layer 142 can be formed of an organic material, for example, silicon oxycarbon (SiOxCz), acrylic or epoxy-based resin, but embodiments are not limited thereto.

The second encapsulation layer 143 is disposed on the foreign material covering layer 142 and similarly to the first encapsulation layer 141, can inhibit or prevent the penetration of moisture or oxygen. The second encapsulation layer 143 can be formed of an inorganic material such as silicon nitride (SiNx), silicon oxynitride (SiNxOy), silicon oxide (SiOx), aluminum oxide (AlyOz) or the like, but embodiments are not limited thereto. The second encapsulation layer 143 can be formed of the same material as the first encapsulation layer 141, or can be formed of a material different from that of the first encapsulation layer 141.

Hereinafter, a structure of the organic light emitting element 130 according to an exemplary embodiment of the present disclosure will be described in detail with reference to FIG. 3.

Figure 3:
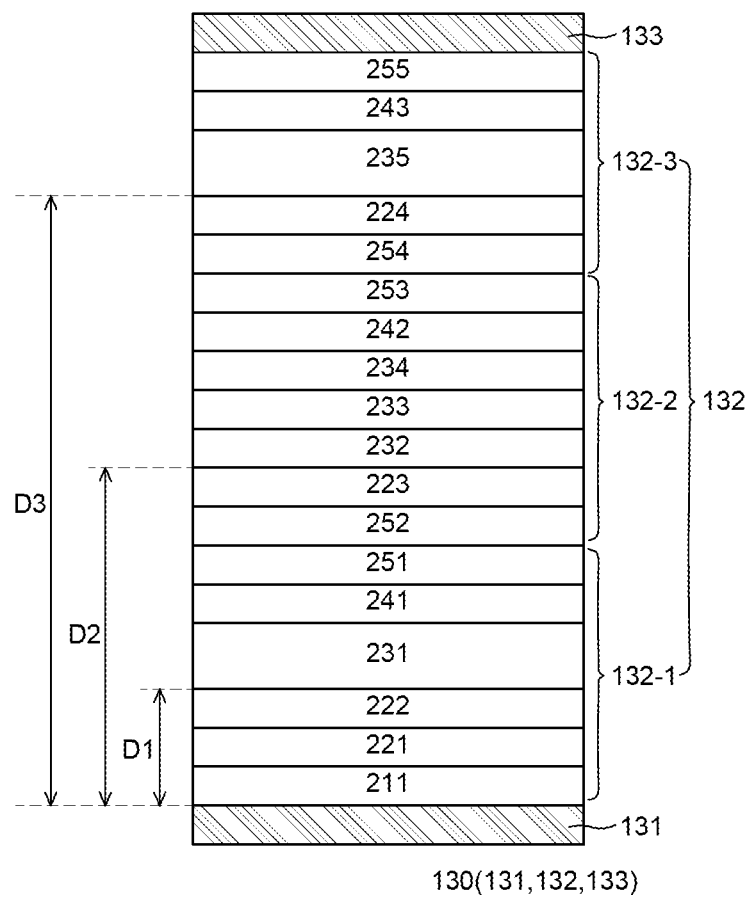
FIG. 3 is a view illustrating a structure of an organic light emitting element of FIG. 2.

FIG. 3 is a view illustrating a structure of an organic light emitting element of FIG. 2. The structure of the organic light emitting element 130 of FIG. 3 can be applied to all or some of the plurality of pixels PX of the organic light emitting display apparatus 100.

With reference to FIG. 3, the organic light emitting element 130 includes the first electrode 131, the light emitting part 132, and the second electrode 133.

The light emitting part 132 is disposed between the first electrode 131 and the second electrode 133. The light emitting part 132 is an area from which light is emitted by a combination of electrons and holes supplied from the first electrode 131 and the second electrode 133, respectively. The light emitting part 132 includes a first light emitting part 132-1, a second light emitting part 132-2, and a third light emitting part 132-3.

The first light emitting part 132-1 is disposed on the first electrode 131. The first light emitting part 132-1 includes a hole injection layer 211, a first hole transporting layer 221, a second hole transporting layer 222, a first light emitting layer 231, a first electron transporting layer 241, and a first N-type charge generating layer 251. Since the first light emitting layer 231 is a fluorescent light emitting layer, the first light emitting part 132-1 can be defined as a fluorescent light emitting unit. The first light emitting part 132-1 may not include the first N-type charge generating layer 251.

The hole injection layer (211) is disposed on the first electrode 131. The hole injection layer 211 is an organic layer that facilitates the injection of holes from the first electrode 131 to the first light emitting layer 231. The hole injection layer 211 can be formed of MTDATA(4,4′,4″-tris (3-methylphenylphenylamino)triphenylamine), CuPc (copper phthalocyanine), PEDOT/PSS(poly(3,4-ethylenedioxythiphene, polystyrene sulfonate) or the like.

The first hole transporting layer 221 and the second hole transporting layer 222 are sequentially disposed on the hole injection layer 211. The first hole transporting layer 221 and the second hole transporting layer 222 are organic layers that smoothly transfer holes from the first electrode 131 to the first light emitting layer 231.

The first hole transporting layer 221 and the second hole transporting layer 222 can be configured by using two or more layers or two or more materials. The first hole transporting layer 221 and the second hole transporting layer 222 can be formed of a material including one or more of, for example, NPD(N,N′-bis(naphthalene-1-yl)-N,N′-bis(phenyl)-2,2′-dimethylbenzidine), NPB(N,N′-bis(naphthalen-1-yl)-N,N′-bis(phenyl)-benzidine), TPD(N,N′-bis-(3-methylphenyl)-N,N′-bis-(phenyl)-benzidine), Spiro-TAD(2,2′,7,7′-tetrakis(N,N-diphenylamino)-9,9′-spirofluorene) and MTDATA(4,4′,4″-Tris(N-3-methylphenyl-N-phenyl-amino)-triphenylamine), but embodiments are not limited thereto.

The second hole transporting layer 222 can function as an electron blocking layer (EBL). The electron blocking layer is an organic layer for blocking electrons injected into the first light emitting layer 231 from being transferred to the first hole transporting layer 221 and the second hole transporting layer 222. The electron blocking layer can block the movement of electrons to improve the combination of holes and electrons in the first light emitting layer 231, thereby improving light emission efficiency of the first light emitting layer 231. The electron blocking layer can be disposed as a separate layer from the second hole transporting layer 222. As another example, the second hole transporting layer 222 can be omitted.

In the first light emitting layer 231, holes supplied from the first electrode 131 and electrons supplied from the second electrode 133 recombine with each other, thereby generating excitons. In addition, an area where excitons are generated can be referred to as an emission zone or an emission area, or a recombination zone or a recombination area.

The first light emitting layer 231 is disposed between the second hole transporting layer 222 and the first electron transporting layer 241. The first light emitting layer 231 is a fluorescent light emitting layer. The first light emitting layer 231 is disposed at a portion where excitons are formed in the first light emitting part 132-1 and includes a material capable of emitting light of a specific color. The first light emitting layer 231 can include a material capable of emitting blue light.

The first light emitting layer 231 can have a host-dopant system. For example, the first light emitting layer 231 can have a system in which a host material having a large weight ratio is doped with a light emitting dopant material having a small weight ratio. A host of the first light emitting layer 231 can be configured of a single host including a single material or a mixed host including a mixed material. The first light emitting layer 231 including a single host material or a mixed host material is doped with a blue fluorescent dopant material. For example, the first light emitting layer 231 is a blue light emitting layer, and a wavelength range of light emitted from the first light emitting layer 231 can be 440 nm to 480 nm.

The blue fluorescent dopant material can emit blue light. An EL spectrum of light emitted from the first light emitting layer 231 doped with the blue fluorescent dopant material can have a peak in a blue wavelength region, have a peak in a dark blue wavelength region, or have a peak in a sky-blue wavelength region.

The host material of the first light emitting layer 231 can be formed of a mixture of one or more of $Alq_3$(tris(8-hydroxy-quinolino)aluminum), ADN(9,10-di(naphth-2-yl) anthracene), and BSBF(2-(9,9-spirofluoren-2-yl)-9,9-spirofluorene), but embodiments of the present disclosure are not limited thereto.

The blue fluorescent dopant material of the first light emitting layer 231 can be formed of a material including one or more of pyrenes substituted with an aryl amine-based compound, $(4,6-F_2ppy)_2$Irpic FJrPic(bis(3,5-difluoro-2-(2-pyridyl)phenyl-(2-carboxyprdidyl)iridium), an iridium (Ir) ligand complex including $Ir(ppy)_3$(factris(2-phenylpyridine) iridium)(tris(2-phenylpyridine)iridium, spiro-DPVBi, spiro-6P, spiro-BDAVBi(2,7-bis[4-(diphenylamino)styryl]-9,9′-spirofluorene), distyryl benzene (DSB), distyryl arylene (DSA), polyfluorene (PFO)-based polymer and poly(p-phenylene vinylene) (PPV)-based polymer, but embodiments of the present disclosure are not limited thereto.

A thickness D1 between the first electrode 131 (e.g., an upper surface of the first electrode 131) and a lower surface of the first light emitting layer 231 can be about 220 Å to 620 Å. For example, the thickness D1 between the first electrode 131 and the lower surface of the first light emitting layer 231 can be in a range capable of having a maximum light emission range in the light emitting area of the first light emitting layer 231. Since light of a wavelength corresponding to a light emission peak can be emitted in the maximum light emission range, the light emitting part 132 can exhibit maximum luminance.

The first electron transporting layer 241 is disposed on the first light emitting layer 231. The first electron transporting layer 241 is supplied with electrons from the first N-type charge generating layer 251. The first electron transporting layer 241 transfers the supplied electrons to the first light emitting layer 231.

The first electron transporting layer 241 can function as a hole blocking layer (HBL). The hole blocking layer can prevent holes which do not participate in the recombination from being leaked from the first light emitting layer 231.

The first electron transporting layer 241 can be formed of one or more of, for example, PBD(2-(4-biphenyl)-5-(4-tert-butylphenyl)-1,3,4-oxadiazole), TAZ(3-(4-biphenyl)-4-phenyl-5-tert-butylphenyl-1,2,4-triazole), BAlq(Bis(2-mthyl-8-quinolinolate)-4-(phenylphenolato)aluminium), Liq(8-hydroxyquinolinolato-lithium), TPBi(2,2',2"-(1,3,5-benzinetriyl)-tris(1-phenyl-1-H-benzimidazole), Liq(8-hydroxyquinolinolato-lithium) and BCP(2,9-Dimethyl-4,7-diphenyl-1,10-phenanthroline), but embodiments are not limited thereto.

The first N-type charge generating layer 251 is disposed on the first electron transporting layer 241. The first N-type charge generating layer 251 injects electrons into the first light emitting part 132-1. The first N-type charge generating layer 251 is disposed between the first light emitting part 132-1 and the second light emitting part 132-2 to supply electric charges to the first light emitting part 132-1.

The first N-type charge generating layer 251 can include an N-type dopant material and an N-type host material. The N-type dopant material can be a metal of Group 1 and Group 2 on the periodic table, an organic material which can inject the electrons, or a mixture thereof. For example, the N-type dopant material can be one or more of an alkali metal and an alkaline earth metal. For example, the first N-type charge generating layer 251 can be formed of an organic layer doped with an alkali metal such as lithium (Li), sodium (Na), potassium (K), or cesium (Cs) or an alkali earth metal such as magnesium (Mg), strontium (Sr), barium (Ba), or radium (Ra), but is not limited thereto. The N-type host material can be formed of a material which is capable of transmitting electrons, for example, one or more of $Alq_3$(tris(8-hydroxyquinolino)aluminum), Liq(8-hydroxyquinolinolato-lithium), PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, BAlq(bis(2-methyl-8-quinolinolate)-4-(phenylphenolato)aluminium), SAlq, TPBi(2,2',2-(1,3,5-benzinetriyl)-tris(1-phenyl-1-H-benzimidazole), oxadiazole, triazole, phenanthroline, benzoxazole or benzthiazole, but embodiments are not limited thereto.

The second light emitting part 132-2 is disposed on the first light emitting part 132-1. The second light emitting part 132-2 includes a first P-type charge generating layer 252, a third hole transporting layer 223, a second light emitting layer 232, a third light emitting layer 233, a fourth light emitting layer 234, a second electron transporting layer 242, and a second N-type charge generating layer 253. Since the second light emitting layer 232, the third light emitting layer 233, and the fourth light emitting layer 234 are phosphorescent light emitting layers, the second light emitting part 132-2 can be defined as a phosphorescent light emitting part. As another example, the second light emitting part 132-2 may not include the first P-type charge generating layer 252 and the second N-type charge generating layer 253.

The first P-type charge generating layer 252 is disposed on the first N-type charge generating layer 251. The first P-type charge generating layer 252 injects holes into the second light emitting part 132-2. The first P-type charge generating layer 252 is disposed between the first light emitting part 132-1 and the second light emitting part 132-2 to supply electric charges to the second light emitting part 132-2.

The first P-type charge generating layer 252 can include a P-type dopant material and a P-type host material. The P-type dopant material can be formed of metal oxide, an organic material such as tetrafluoro-tetracyanoquinodimethane (F4-TCNQ), HAT-CN (Hexaazatriphenylene-hexacarbonitrile), or hexaazatriphenylene, or a metal material such as $V_2O_5$, MoOx, and $WO_3$, but is not limited thereto. The P-type host material can be formed of a material which is capable of transmitting holes, for example, a material including any one or more of NPD(N,N-dinaphthyl-N,N'-diphenyl benzidine)(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine) and MTDATA(4,4',4-Tris(N-3-methylphenyl-N-phenyl-amino)-triphenylamine), but embodiments of the present disclosure are not limited thereto.

The third hole transporting layer 223 is disposed on the first P-type charge generating layer 252. The third hole transporting layer 223 is an organic layer that smoothly transfers holes from the first P-type charge generating layer 252 to the second light emitting layer 232, the third light emitting layer 233, and the fourth light emitting layer 234. Since the third hole transporting layer 223 is substantially the same as the first hole transporting layer 221 and the second hole transporting layer 222 of the first light emitting part 132-1, a redundant description will be omitted or will be brief.

The second light emitting layer 232, the third light emitting layer 233, and the fourth light emitting layer 234 are sequentially disposed between the third hole transporting layer 223 and the second electron transporting layer 242. The second light emitting layer 232, the third light emitting layer 233, and the fourth light emitting layer 234 are phosphorescent light emitting layers. The second light emitting layer 232, the third light emitting layer 233, and the fourth light emitting layer 234 are disposed at a position where excitons are formed in the second light emitting part 132-2 and emit light of a specific color. The second light emitting layer 232 can include a material capable of emitting red light, and the third light emitting layer 233 and the fourth light emitting layer 234 can include a material capable of emitting yellow-green light. The fourth light emitting layer 234 can be omitted. For example, the second light emitting part 132-2 can also be configured of the second light emitting layer 232 and the third light emitting layer 233.

The second light emitting layer 232, the third light emitting layer 233, and the fourth light emitting layer 234 can have a host-dopant system as in the first light emitting layer 231. Each of the second light emitting layer 232, the third light emitting layer 233, and the fourth light emitting layer 234 can include a single host or a mixed host, and at least one dopant. When the second light emitting layer 232, the third light emitting layer 233, and the fourth light emitting layer 234 include a mixed host, the mixed host can include a hole-type host and an electron-type host. When the second light emitting layer 232, the third light emitting layer 233, and the fourth light emitting layer 234 are configured of the mixed host, the host can be uniformly deposited in the organic light emitting layer, which generates an effect of improving the efficiency of the organic light emitting layer.

The second light emitting layer 232 is a phosphorescent light emitting layer. The second light emitting layer 232 can include a first hole-type host and a first electron-type host, and can be doped with a red phosphorescent dopant material. For example, the second light emitting layer 232 can be a red light emitting layer, and a wavelength range of light emitted from the second light emitting layer 232 can be 600 nm to 650 nm.

The red phosphorescent dopant material is a material capable of emitting red light. An EL spectrum of light emitted from the second light emitting layer 232 which is doped with the red phosphorescent dopant material can have a peak in a red wavelength region.

A host material of the second light emitting layer 232 can be formed of a mixture of one or more of CBP(4,4'bis(carbozol-9-yl)biphenyl) and MCP(1,3-bis (carbazol-9-yl)benzene), but embodiments of the present disclosure are not limited thereto.

The red phosphorescent dopant material of the second light emitting layer 232 can be formed of a material including any one or more of an iridium (Ir) ligand complex including Ir(ppy)$_3$(tris(2-phenylpyridine)iridium(III)), Ir(ppy)$_2$(acac)(Bis(2-phenylpyridine)(acetylacetonato)iridium(III)), PIQIr(acac)(bis(1-phenylisoquinoline) acetylacetonate iridium), PQIr(acac)(bis(1-phenylquinoline) acetylacetonate iridium), PQIr(tris(1-phenylquinoline)iridium) Ir(piq)$_3$(tris(1-phenylisoquinoline)iridium), and Ir(piq)$_2$(acac)(bis(1-phenylisoquinoline)(acetylacetonate) iridium), PtOEP(octaethylporphyrinporphine platinum), PBD:Eu(DBM)$_3$(Phen) or Perylene. However, embodiments of the present disclosure are not limited thereto.

The third light emitting layer 233 includes a second hole-type host and a second electron-type host that are the same as those of the fourth light emitting layer 234. However, a ratio of the second hole-type host and a ratio of the second electron-type host can differ in each of the third light emitting layer 233 and the fourth light emitting layer 234.

For example, the third light emitting layer 233 is disposed closer to the first electrode 131 that supplies holes than the fourth light emitting layer 234, and the fourth light emitting layer 234 is disposed closer to the second electrode 133 that supplies electrons than the third light emitting layer 233. For example, the third light emitting layer 233 can have a higher ratio of the second electron-type host to smoothly supply electrons, compared to the second hole-type host, and the fourth light emitting layer 234 can have a higher ratio of the second hole-type host to smoothly supply holes, compared to the second electron-type host. Therefore, the ratios of the second hole-type host and the second electron-type host can be differently configured according to types of carriers that are relatively hard to reach the respective light emitting layers.

The third light emitting layer 233 and the fourth light emitting layer 234 are phosphorescent light emitting layers and are doped with a yellow-green phosphorescent dopant material. For example, the third light emitting layer 233 and the fourth light emitting layer 234 can be yellow-green light emitting layers, and a wavelength range of light emitted from the third light emitting layer 233 and the fourth light emitting layer 234 can be 510 nm to 590 nm.

The yellow-green phosphorescent dopant material is a material capable of emitting light in a yellow-green wavelength region. An EL spectrum of light emitted from the third light emitting layer 233 and the fourth light emitting layer 234 which are doped with the yellow-green dopant material can have a peak only in the yellow-green wavelength region, or have a first peak in the yellow-green wavelength region and a second peak having intensity less than that of the first peak in a red wavelength region, or have a first peak in the yellow-green wavelength region and an inflection point between the yellow-green wavelength region and the red wavelength region.

Host materials of the third light emitting layer 233 and the fourth light emitting layer 234 can be formed of a mixture of one or more of CBP(4,4'bis(carbozol-9-yl)biphenyl) and MCP(1,3-bis (carbazol-9-yl) benzene), but embodiments of the present disclosure are not limited thereto.

The yellow-green dopant material of the third light emitting layer 233 and the fourth light emitting layer 234 can be formed of a material including any one or more of an iridium (Ir) ligand complex including Ir(ppy)$_3$(tris(2-phenylpyridine)iridium(III)) or Ir(ppy)$_2$(acac)(Bis(2-phenylpyridine)(acetylacetonato)iridium(III)), or Alq$_3$(tris(8-hydroxyquinolino)aluminum), but embodiments of the present disclosure are not limited thereto.

A wavelength range of the second light emitting part 132-2 including the second light emitting layer 232, the third light emitting layer 233, and the fourth light emitting layer 234 can be 510 nm to 650 nm. For example, a wavelength range of the second light emitting layer 232, which is a red light emitting layer, can be 600 nm to 650 nm, and a wavelength range of the third light emitting layer 233 and the fourth light emitting layer 234 which are yellow-green light emitting layers, can be 510 nm to 590 nm when the yellow-green dopant material has a peak in the yellow-green wavelength range. Accordingly, the wavelength range of the second light emitting part 132-2 can be a minimum of 510 nm and a maximum of 650 nm.

The second light emitting layer 232, which is a red light emitting layer, can be disposed on the third light emitting layer 233 and the fourth light emitting layer 234, which are yellow-green light emitting layers. For example, a vertical arrangement of the second light emitting layer 232, the third light emitting layer 233, and the fourth light emitting layer 234 can be changed. For example, the third light emitting layer 233 and the fourth light emitting layer 234 which are yellow-green light emitting layers are sequentially disposed on the third hole transporting layer 223, and then, the second light emitting layer 232 which is a red light emitting layer, can be disposed on the fourth light emitting layer 234.

A thickness D2 between the first electrode 131 (e.g., an upper surface of the first electrode 131) and the second light emitting layer 232 (e.g., a lower surface of the second light emitting layer 232) which is the red light emitting layer or the third light emitting layer 233 (e.g., a lower surface of the third light emitting layer 233) which is the yellow-green light emitting layer can be about 1740 Å to 2140 Å. For example, when the third light emitting layer 233 and the fourth light emitting layer 234 are disposed on the second light emitting layer 232, the thickness D2 between a lower surface of the second light emitting layer 232 and the first electrode 131 can be about 1740 Å to 2140 Å. When the second light emitting layer 232 is disposed on the third light emitting layer 233 and the fourth light emitting layer 234, the thickness D2 between the lower surface of the second light emitting layer 232 and the first electrode 131 can be about 1740 Å to 2140 Å. For example, the thickness D2 between the first electrode 131 and the lower surface of the second light emitting layer 232 and/or the third light emitting layer 233 and/or the fourth light emitting layer 234 can be in a range capable of having a maximum emission range in the light emitting area of the second light emitting layer 232 and/or the third light emitting layer 233 and/or the fourth light emitting layer 234. Since light of a wavelength corresponding to a light emission peak can be emitted in the maximum light emission range, the light emitting part 132 can exhibit maximum luminance.

The second electron transporting layer 242 is disposed on the fourth light emitting layer 234. The second electron transporting layer 242 is supplied with electrons from the second N-type charge generating layer 253. The second electron transporting layer 242 transfers the supplied electrons to the second light emitting layer 232, the third light emitting layer 233, and the fourth light emitting layer 234. Since the second electron transporting layer 242 is substantially the same as the first electron transporting layer 241 of the first light emitting part 132-1, a redundant description will be omitted or will be brief.

The second N-type charge generating layer 253 is disposed on the second electron transporting layer 242. The second N-type charge generating layer 253 injects electrons into the second light emitting part 132-2. The second N-type charge generating layer 253 is disposed between the second light emitting part 132-2 and the third light emitting part 132-3 to supply electric charges to the second light emitting part 132-2. Since the second N-type charge generating layer 253 is substantially the same as the first N-type charge generating layer 251 of the first light emitting part 132-1, a redundant description will be omitted or will be brief.

The third light emitting part 132-3 is disposed on the second light emitting part 132-2. The third light emitting part 132-3 includes a second P-type charge generating layer 254, a fourth hole transporting layer 224, a fifth light emitting layer 235, a third electron transporting layer 243, and a third N-type charge generating layer 255. Since the fifth light emitting layer 235 is a fluorescent light emitting layer, the third light emitting part 132-3 can be defined as a fluorescent light emitting part. As another example, the third light emitting part 132-3 may not include the second P-type charge generating layer 254.

The second P-type charge generating layer 254 is disposed on the second N-type charge generating layer 253. The second P-type charge generating layer 254 injects holes into the third light emitting part 132-3. The second P-type charge generating layer 254 is disposed between the second light emitting part 132-2 and the third light emitting part 132-3 to supply electric charges to the third light emitting part 132-3. Since the second P-type charge generating layer 254 is substantially the same as the first P-type charge generating layer 252 of the second light emitting part 132-2, a redundant description will be omitted or will be brief.

The fourth hole transporting layer 224 is sequentially disposed on the second P-type charge generating layer 254. The fourth hole transporting layer 224 is an organic layer that smoothly transfers holes from the second P-type charge generating layer 254 to the fifth light emitting layer 235. Since the fourth hole transporting layer 224 is substantially the same as the first hole transporting layer 221 or the second hole transporting layer 222 of the first light emitting part 132-1, a redundant description will be omitted or will be brief.

The fifth light emitting layer 235 is disposed between the fourth hole transporting layer 224 and the third electron transporting layer 243. The fifth light emitting layer 235 is disposed at a position where excitons are formed in the third light emitting part 132-3 and includes a material capable of emitting light of a specific color. The fifth light emitting layer 235 can include a material capable of emitting blue light. Since the fifth light emitting layer 235 is substantially the same as the first light emitting layer 231 of the first light emitting part 132-1, a redundant description will be omitted or will be brief.

A thickness D3 between the first electrode 131 (e.g., an upper surface of the first electrode 131) and a lower surface of the fifth light emitting layer 235 can be about 2730 Å to 3130 Å. For example, the thickness D3 between the first electrode 131 and the lower surface of the fifth light emitting layer 235 can be in a range capable of having a maximum light emission range in the light emitting area of the fifth light emitting layer 235. Since light of a wavelength corresponding to a light emission peak can be emitted in the maximum light emission range, the light emitting part 132 can exhibit maximum luminance.

The third electron transporting layer 243 is disposed on the fifth light emitting layer 235. The third electron transporting layer 243 is supplied with electrons from the second electrode 133. The third electron transporting layer 243 transfers the supplied electrons to the fifth light emitting layer 235. Since the third electron transporting layer 243 is substantially the same as the first electron transporting layer 241 of the first light emitting part 132-1, a redundant description will be omitted or will be brief.

The third N-type charge generating layer 255 is disposed on the third electron transporting layer 243. The third N-type charge generating layer 255 injects electrons into the third light emitting part 132-3. The third N-type charge generating layer 255 is disposed between the third light emitting part 132-3 and the second electrode 133 to supply electric charges to the third light emitting part 132-3. Since the third N-type charge generating layer 255 is substantially the same as the first N-type charge generating layer 251 of the first light emitting part 132-1, a redundant description will be omitted or will be brief.

An overall thickness of the third light emitting part 132-3 can be 1200 Å to 1800 Å. In addition, a distance between a center of the fifth light emitting layer 235 and a lower surface of the second electrode 133 can be 100 Å to 700 Å.

The organic light emitting element 130 has a 3-stack structure in which the first light emitting part 132-1, the second light emitting part 132-2, and the third light emitting part 132-3 are stacked. Light finally emitted from the light emitting part 132 is implemented by mixing light emitted from each of the first light emitting part 132-1, the second light emitting part 132-2, and the third light emitting part 132-3. Therefore, a design of the light emitting part 132 can also vary according to a color of light to be implemented. For example, the first light emitting part 132-1 and the third light emitting part 132-3 are fluorescent light emitting parts and emit blue light, and the second light emitting part 132-2 is a phosphorescent light emitting part and emits red light and yellow-green light. Thus, the organic light emitting element 130 according to an exemplary embodiment of the present disclosure can be an organic light emitting element 130 that emits white light.

With reference to FIG. 2, a color filter 150 is disposed on the encapsulation part 140. The color filter 150 directly contacts an upper surface of the encapsulation part 140. The color filter 150 can be provided in plural, and the plurality of color filters 150 respectively correspond to the plurality of sub-pixels SP. The color filter 150 converts light emitted from the light emitting part 132 into light of a specific color. For example, the color filter 150 can be configured of one among a red color filter 150R, a green color filter 150G, and a blue color filter 150B. For example, white light emitted from the light emitting part 132 is converted into red light, green light, and blue light by the color filter 150. The color filter 150 can correspond to each of the plurality of sub-pixels SP in a single pixel PX. The color filter 150 may not be disposed in the white sub-pixel SP_W. This will be described later with reference to FIG. 3.

A planarization layer 160 is disposed on the color filter 150. The planarization layer 160 directly contacts an upper surface and a side surface of the color filter 150 and an upper surface of the encapsulation part 140. The planarization layer 160 planarizes an upper portion of the substrate 110 on which the color filter 150 is disposed. Similarly to the overcoating layer 115, the planarization layer 160 can be formed of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene and photoresist, but embodiments of the present disclosure are not limited thereto.

The light extraction pattern 170 is disposed on the planarization layer 160. The light extraction pattern 170 can directly contact an upper surface of the planarization layer 160. The light extraction pattern 170 can be provided in plural, and the plurality of light extraction patterns 170 can be provided in each of the plurality of sub-pixels SP. The light extraction patterns 170 disposed in each sub-pixel SP can be disposed only in an area overlapping the color filter 150, for example, in the light emitting area, but embodiments of the present disclosure are not limited thereto.

The light extraction patterns 170 can be formed to protrude convexly. For example, the light extraction pattern 170 can have a shape in which it is convex at a central portion thereof and has a gentle slope toward both side portions thereof from the central portion. The light extraction patterns 170 can be disposed to have different shapes in each of the plurality of sub-pixels SP. Accordingly, when the organic light emitting display apparatus 100 is driven in dark conditions by the light extraction patterns 170, front luminance of the pixel PX can be improved.

A refractive index of the light extraction patterns 170 can be greater than or equal to a refractive index of the planarization layer 160. Accordingly, total reflection of light emitted from the light emitting part 132 at an interface between the planarization layer 160 and the light extraction patterns 170 is prevented, and the light can pass through the light extraction patterns 170 and be emitted outwardly. In addition, the light extraction patterns 170 can be formed of a material having a small absorption rate. Accordingly, absorption of light into the light extraction patterns 170 is minimized, and the light can be easily emitted outwardly through the light extraction pattern 170. In addition, the light extraction patterns 170 are components disposed at the outermost portion of the organic light emitting display apparatus 100 and thus, are exposed outwardly. Accordingly, the light extraction patterns 170 need to have sufficient hardness so as not to be damaged by impact.

The light extraction patterns 170 can be formed by one of a photolithography process, an imprinting process, and an inkjet process, but embodiments of the present disclosure are not limited thereto. In addition, the light extraction patterns 170 can be formed of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene and photoresist, but embodiments of the present disclosure are not limited thereto.

Figure 4:
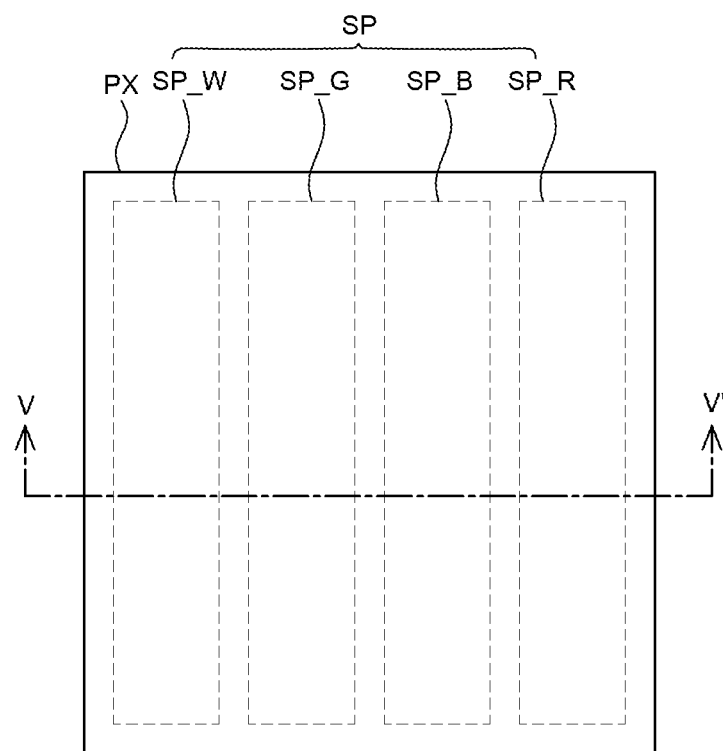
FIG. 4 is an enlarged plan view of one pixel of the organic light emitting display apparatus according to an exemplary embodiment of the present disclosure.
Figure 5:
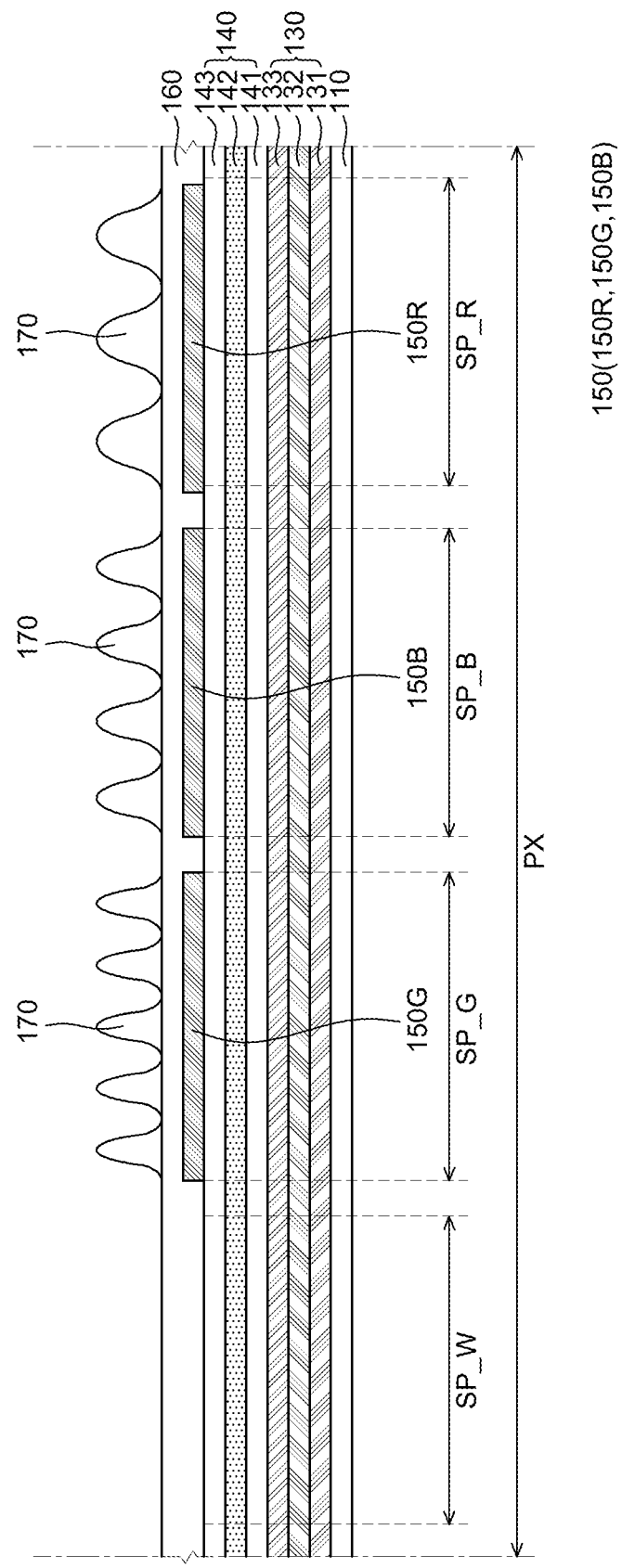
FIG. 5 is a cross-sectional view taken along line V-V' of FIG. 4.

FIG. 4 is an enlarged plan view of one pixel of the organic light emitting display apparatus according to an exemplary embodiment of the present disclosure. FIG. 5 is a cross-sectional view taken along line V-V' of FIG. 4. In FIG. 5, only the substrate 110, the light emitting element 130, the encapsulation part 140, the color filter 150, the planarization layer 160, and the light extraction patterns 170 are schematically illustrated for convenience of illustration.

First, with reference to FIG. 4, each of the plurality of pixels PX disposed in the display area AA of the organic light emitting display apparatus 100 includes the plurality of sub-pixels SP. The light emitting element 130 is disposed in each of the plurality of sub-pixels SP to correspond thereto. As an example, the plurality of sub-pixels SP can include a red sub-pixel SP_R, a green sub-pixel SP_G, a blue sub-pixel SP_B, and a white sub-pixel SP_W. The plurality of sub-pixels SP can be arranged in a stripe shape, but embodiments of the present disclosure are not limited thereto. In addition, FIG. 4 illustrates that a single pixel PX includes four sub-pixels SP, for example, a red sub-pixel SP_R, a green sub-pixel SP_G, a blue sub-pixel SP_B, and a white sub-pixel SP_W. However, embodiments of the present disclosure are not limited thereto. For example, the white sub-pixel SP_W can be omitted. An area of the sub-pixel SP illustrated in FIG. 4 can correspond to the light emitting area of the light emitting element 130 or an area where the color filter 150 is disposed.

With reference to FIG. 5, the light emitting element 130, the color filter 150, and the light extraction patterns 170 are disposed on the substrate 110. The organic light emitting element 130 can emit white light. Also, the color filter 150 can be provided in plural, and the plurality of color filters 150 can respectively correspond to each of the sub-pixels SP. Alternatively, one or more of the sub-pixels SP may be disposed without color filter. For example, as illustrated in FIG. 5, three color filters 150 can be configured to correspond to the respective sub-pixels SP. For example, the color filter 150 corresponding to the red sub-pixel SP_R can be a red color filter 150R, the color filter 150 corresponding to the green sub-pixel SP_G can be a green color filter 150G, and the color filter 150 corresponding to the blue sub-pixel SP_B can be a blue color filter 150B, and there can be no color filter 150 disposed in the white sub-pixel SP_W. Accordingly, white light emitted from the light emitting element 130 can be converted into red, green, or blue light by the color filter 150 of the sub-pixel SP corresponding thereto.

The plurality of light extraction patterns 170 are disposed to correspond to each of the plurality of sub-pixels SP. For example, the plurality of light extraction patterns 170 can be disposed in each of the red sub-pixel SP_R, the green sub-pixel SP_G, and the blue sub-pixel SP_B. However, the plurality of light extraction patterns 170 may not be disposed in the white sub-pixel SP_W. Accordingly, a traveling path of light that passes through the color filter 150 disposed in each sub-pixel SP, among white light emitted from the organic light emitting element 130, can be changed by the plurality of light extraction patterns 170.

The plurality of light extraction patterns 170 can have different shapes in a vertical section of the display apparatus. In other words, the plurality of light extraction patterns 170 can have different stereoscopic (3-dimensional/3D) shapes with each other. For example, the plurality of light extraction patterns 170 can have different aspect ratios in each of the plurality of sub-pixels SP. For example, among the plurality of sub-pixels SP, the aspect ratio of the plurality of light extraction patterns 170 can be the highest in the green sub-pixel SP_G and can be the lowest in the red sub-pixel SP_R. In addition, among the plurality of light extraction patterns 170, the aspect ratio of the light extraction patterns 170 disposed in the blue sub-pixel SP_B can be lower than the aspect ratio of the light extraction patterns 170 disposed in the green sub-pixel SP_G and can be greater than the aspect ratio of the light extraction patterns 170 disposed in the red sub-pixel SP_R. For example, the aspect ratio of the light extraction patterns 170 disposed in the green sub-pixel SP_G is about 1.2, the aspect ratio of the light extraction patterns 170 disposed in the blue sub-pixel SP_B is about 1.1, and the aspect ratio of the light extraction patterns 170 disposed in the red sub-pixel SP_R can be about 1.0. However, in FIG. 5, the light extraction patterns 170 are illustrated so that differences in aspect ratio of the light extraction patterns 170 in each of the plurality of sub-pixels SP are greater than the above-described aspect ratio values to more clearly illustrate the differences in aspect ratio.

In the respective sub-pixels of the organic light emitting display apparatus, white light emitted from the organic light emitting element including the white light emitting part passes through the color filer, whereby different colored light having different wavelengths can be emitted. Accordingly, an internal light distribution of each sub-pixel can differ depending on a wavelength of emitted light. For example, the red sub-pixel can have an internal light distribution toward a front direction, the blue sub-pixel can have an internal light distribution at an angle of 20°, and the green sub-pixel can have an internal light distribution at an angle of 30°. Accordingly, when light extraction patterns having the same structure are applied to the respective sub-pixels, a traveling path of light emitted from one sub-pixel can be changed such that the light is directed toward a front direction of the organic light emitting display apparatus, but a traveling path of light emitted from another sub-pixel can be changed such that the light is directed toward a side portion of the organic light emitting display apparatus. For example, front luminance can be excellent in one sub-pixel, but can be lowered in another sub-pixel.

Accordingly, in the organic light emitting display apparatus 100 according to an exemplary embodiment of the present disclosure, the aspect ratios of the plurality of light extraction patterns 170 differ in the plurality of sub-pixels SP, whereby front luminance of the organic light emitting display apparatus 100 can be improved. The respective sub-pixels SP which emit light of different colors have different internal light distributions. Accordingly, to direct the light emitted from the respective sub-pixels SP toward the front direction, an angle at which a traveling direction of the light emitted from each sub-pixel SP is changed to be different in the respective sub-pixels SP. Thus, in the aspect ratios of the light extraction patterns 170 in the respective sub-pixels SP, the aspect ratio of the light extraction patterns 170 disposed in the green sub-pixel SP_G is the highest, the aspect ratio of the light extraction patterns 170 disposed in the red sub-pixel SP_R is the lowest, and the aspect ratio of the light extraction patterns 170 disposed in the blue sub-pixel SP_B can have a value between the aspect ratio of the light extraction patterns 170 disposed in the green sub-pixel SP_G and the aspect ratio of the light extraction patterns 170 disposed in the red sub-pixel SP_R. For example, the aspect ratio of the light extraction patterns 170 disposed in the red sub-pixel SP_R can be about 1.0, the aspect ratio of the light extraction patterns 170 disposed in the green sub-pixel SP_G can be about 1.2, and the aspect ratio of the light extraction patterns 170 disposed in the blue sub-pixel SP_B can be about 1.1. Accordingly, front luminance of the organic light emitting display apparatus 100 can be improved by allowing the light extraction patterns 170 disposed in each sub-pixel SP to have an aspect ratio in which the front luminance of each sub-pixel SP can be optimized.

Figure 6:
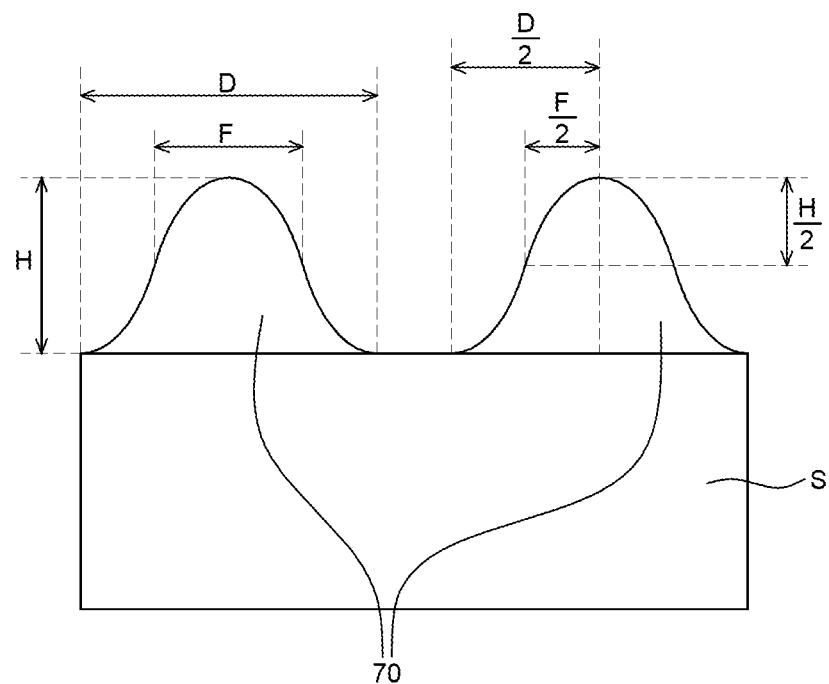
FIG. 6 is a cross-sectional view illustrating a light extraction pattern in an organic light emitting display apparatus according to a comparative example.
Figure 7:
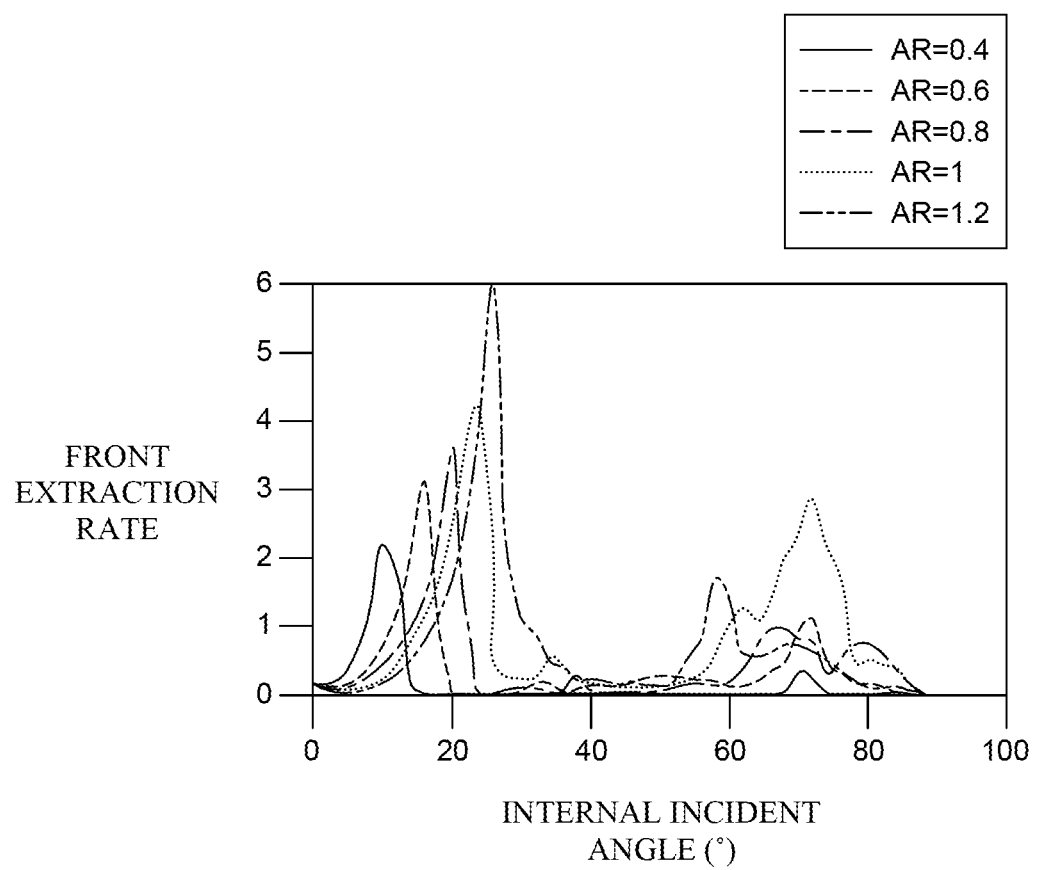
FIG. 7 is a graph obtained by simulating a front extraction rate in accordance with an internal incident angle in the light extraction pattern of FIG. 6.

FIG. 6 is a cross-sectional view illustrating a light extraction pattern in an organic light emitting display apparatus according to a comparative example. FIG. 7 is a graph obtained by simulating a front extraction rate in accordance with an internal incident angle in the light extraction pattern of FIG. 6. FIG. 7 is a graph obtained by simulation using a Ray Optics simulation program in the structure of the light extraction pattern 70 of FIG. 6. In the simulation, two light extraction patterns 70 were disposed on a substrate S made of glass. The substrate S was set to have a length and a width of about 200 nm and a thickness of about 6 μm. In addition, the pixel PX in which the light extraction patterns 70 are disposed was set to be 500 μm in length and 500 μm in width.

In addition, D is a length of the light extraction pattern 70, H is a height of the light extraction pattern 70, and F can be a full width at half maximum of the light extraction pattern 70. Also, an aspect ratio AR of the light extraction pattern 70 is 2H/D, and an aspect ratio FAR at the half maximum of the light extraction pattern 70 can be defined as H/F. In FIG. 7, a value of the aspect ratio FAR at the half maximum of the light extraction pattern 70 as compared to the aspect ratio AR of the light extraction pattern 70, for example, FAR/AR, is 0.739, which can be the same value.

With reference to FIG. 7, when the aspect ratio FAR at the half maximum of the light extraction pattern 70 as compared to the aspect ratio AR of the light extraction pattern 70 is the same, it could be confirmed that an optimal front extraction rate in accordance with an internal incident angle, differs depending on a change in the aspect ratio AR of the light extraction pattern 70. For example, it could be confirmed that as the aspect ratio AR of the light extraction pattern 70 increases, the internal incident angle at which the optimal front extraction rate exhibits increases.

Figure 8:
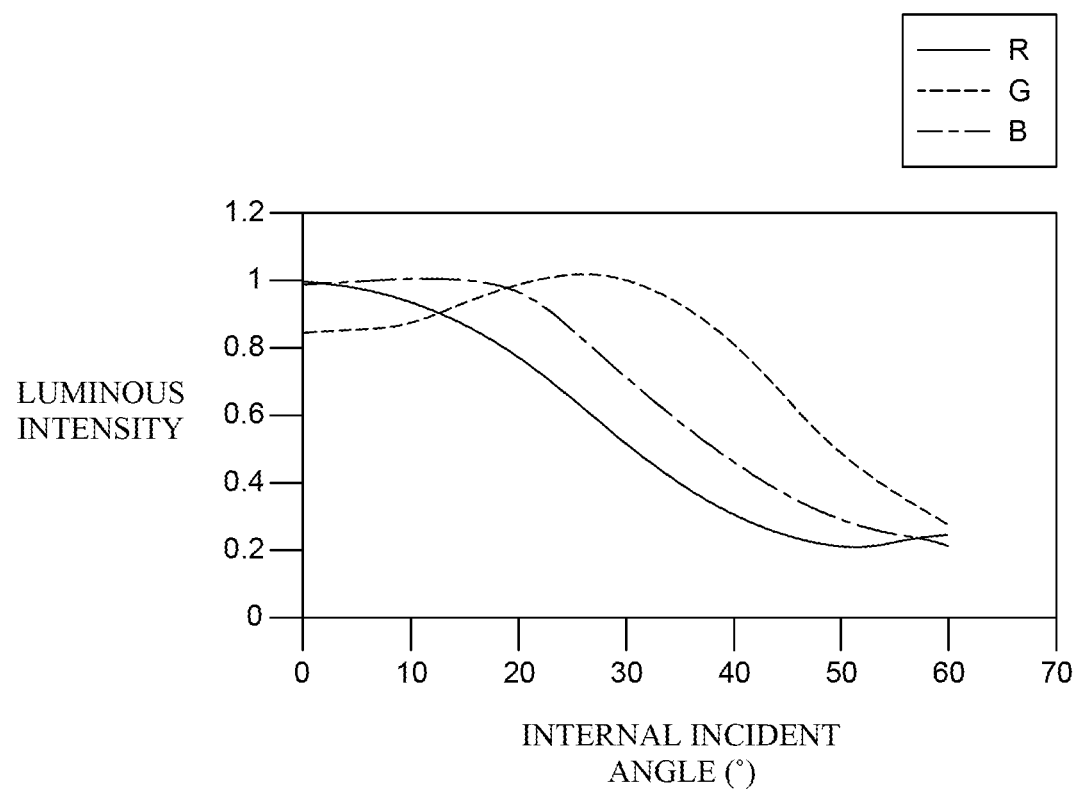
FIG. 8 is a graph illustrating luminous intensity in accordance with an internal incident angle in a plurality of sub-pixels of the organic light emitting display apparatus according to an exemplary embodiment of the present disclosure.
Figure 9:
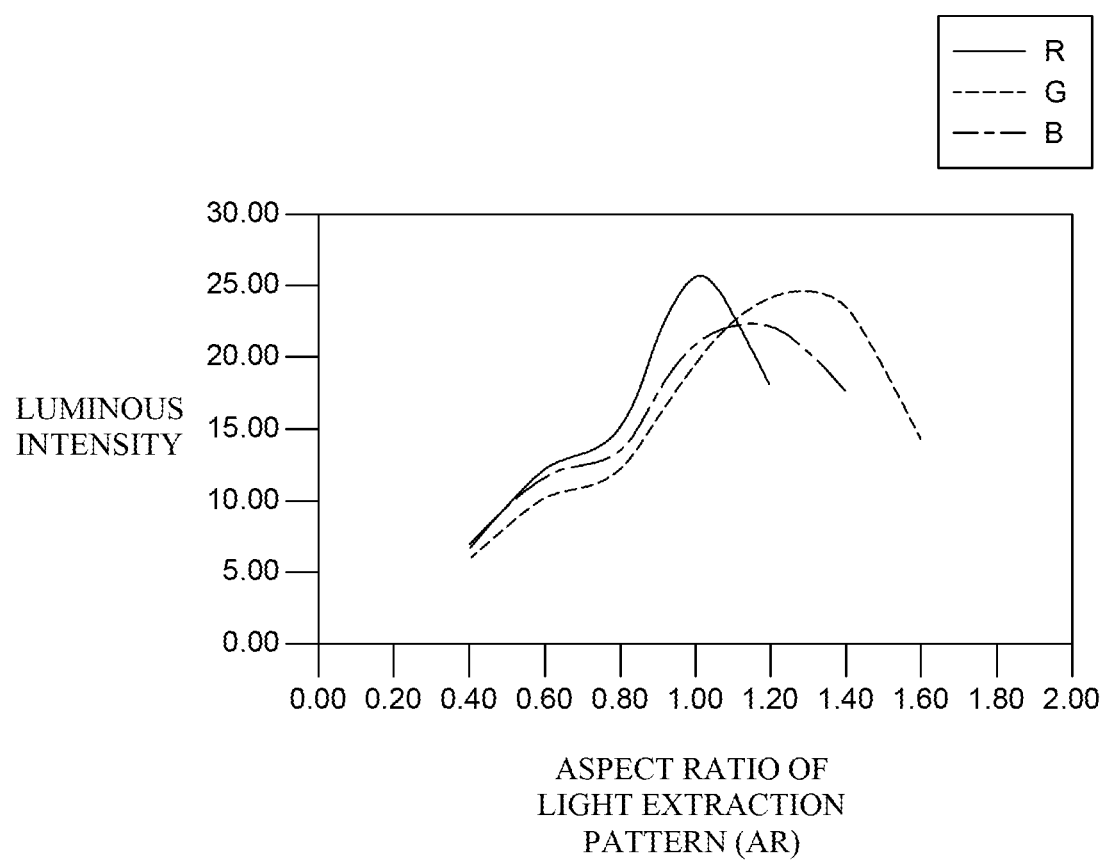
FIG. 9 is a graph obtained by simulating luminous intensity in accordance with an aspect ratio of a light extraction pattern in a plurality of sub-pixels of the organic light emitting display apparatus according to an exemplary embodiment of the present disclosure.

FIG. 8 is a graph illustrating luminous intensity in accordance with an internal incident angle in a plurality of sub-pixels of the organic light emitting display apparatus according to an exemplary embodiment of the present disclosure. FIG. 9 is a graph obtained by simulating luminous intensity in accordance with an aspect ratio of a light extraction pattern in a plurality of sub-pixels of an organic light emitting display apparatus according to an exemplary embodiment of the present disclosure.

In FIG. 9, the value of the aspect ratio FAR at the half maximum of the light extraction pattern 70 as compared to the aspect ratio AR of the light extraction pattern 70, for example, FAR/AR is 0.739, which can be the same. In FIGS. 8 and 9, for convenience of description, FIGS. 1 to 7 can be referred together.

With reference to FIG. 8, when the organic light emitting element 130 has the same structure as the organic light emitting element 130 of the organic light emitting display apparatus 100 according to an exemplary embodiment of the present disclosure, luminous intensity according to an internal incident angle can differ in each of the plurality of sub-pixels SP. For example, the plurality of sub-pixels SP can respectively have different internal light distributions. For example, when the organic light emitting element 130 is a three-stack structure in which the first light emitting part 132-1, the second light emitting part 132-2, and the third light emitting part 132-3 are stacked, the thickness between the first electrode 131 and the blue light emitting layer of the first light emitting part 132-1 is 220 Å to 620 Å, the thickness between the first electrode 131 and the red light emitting layer or yellow-green light emitting layer of the second light emitting part 132-2 is 1740 Å to 2140 Å, and the thickness between the first electrode 131 and the blue light emitting layer of the third light emitting part 132-3 is 2730 Å to 3130 Å, the plurality of sub-pixels SP can have internal light distributions as illustrated in FIG. 8. For example, the red sub-pixel SP can have an internal light distribution in the front direction, the blue sub-pixel SP has an internal light distribution of about 20°, and the green sub-pixel SP can have an internal light distribution of about 30°.

With reference to FIG. 9, it could be confirmed that the aspect ratio AR of the light extraction patterns 170 at which the maximum luminous intensity in each sub-pixel SP exhibits is different for each sub-pixel SP. For example, in the red sub-pixel SP, it could be confirmed that the maximum luminous intensity is shown when the aspect ratio AR of the light extraction patterns 170 is about 1.0. In the blue sub-pixel SP, it could be confirmed that the maximum luminous intensity is shown when the aspect ratio AR of the light extraction patterns 170 is about 1.1. In the green sub-pixel SP, it could be confirmed that the maximum luminous intensity is shown when the aspect ratio AR of the light extraction patterns 170 is about 1.2. For example, as shown in FIG. 8, since the respective sub-pixels SP have different internal light distributions, the aspect ratio AR of the light extraction patterns 170 at which optimal luminous intensity exhibits can differ in the respective sub-pixels SP.

An organic light emitting display apparatus according to one or more embodiments of the present disclosure will be described below.

An organic light emitting display apparatus according to an embodiment of the present disclosure comprises a substrate including a plurality of pixels having a plurality of sub-pixels, a plurality of organic light emitting elements at the plurality of sub-pixels, and a plurality of light extraction patterns on the plurality of organic light emitting elements and having different shapes at each of the plurality of sub-pixels.

According to some embodiments of the present disclosure, the plurality of light extraction patterns can have different shapes at each of the plurality of sub-pixels in a vertical cross-section of the organic light emitting display apparatus.

According to some embodiments of the present disclosure, the plurality of light extraction patterns can have different three-dimensional (3D) shapes.

According to some embodiments of the present disclosure, each of the plurality of organic light emitting elements can include a white light emitting part, the white light emitting part can include a first light emitting part, a second light emitting part, and a third light emitting part.

According to some embodiments of the present disclosure, the first light emitting part and the third light emitting part can include a blue light emitting layer, and the second light emitting part can include a red light emitting layer and two yellow-green light emitting layers.

According to some embodiments of the present disclosure, each of the plurality of organic light emitting elements can further include a first electrode under the first light emitting part, a thickness between an upper surface of the first electrode and a lower surface of the blue light emitting layer of the first light emitting part can be 220 Å to 620 Å, a thickness between the upper surface of the first electrode and a lower surface of the red light emitting layer or the yellow-green light emitting layer of the second light emitting part can be 1740 Å to 2140 Å, and a thickness between the upper surface of the first electrode and a lower surface of the blue light emitting layer of the third light emitting part can be 2730 Å to 3130 Å.

According to some embodiments of the present disclosure, the plurality of sub-pixels can include a red sub-pixel, a green sub-pixel and a blue sub-pixel, and the plurality of light extraction patterns can have different aspect ratios in the red sub-pixel, the green sub-pixel, and the blue sub-pixel.

According to some embodiments of the present disclosure, among the plurality of light extraction patterns, the aspect ratio of the light extraction pattern in the blue sub-pixel can be less than the aspect ratio of the light extraction pattern in the green sub-pixel and can be greater than the aspect ratio of the light extraction pattern in the red sub-pixel.

According to some embodiments of the present disclosure, the aspect ratio of the light extraction pattern in the green sub-pixel can be 1.2, the aspect ratio of the light extraction pattern in the blue sub-pixel can be 1.1, and the aspect ratio of the light extraction pattern in the red sub-pixel is 1.0.

According to some embodiments of the present disclosure, the plurality of sub-pixels can further include a white sub-pixel.

According to some embodiments of the present disclosure, the light extraction pattern may not be disposed in the white sub-pixel.

According to some embodiments of the present disclosure, the organic light emitting display apparatus can further include an encapsulation part on the plurality of organic light emitting elements, and a plurality of color filters on the encapsulation part to correspond to the plurality of sub-pixels.

According to some embodiments of the present disclosure, the organic light emitting display apparatus can further include a planarization layer configured to planarize an upper portion of the plurality of color filters, the plurality of light extraction patterns can be disposed on the planarization layer.

According to some embodiments of the present disclosure, the plurality of light extraction patterns can directly contact the planarization layer.

According to some embodiments of the present disclosure, the plurality of light extraction patterns can be disposed to overlap the plurality of color filters.

According to some embodiments of the present disclosure, the organic light emitting display apparatus does not include a polarizing plate for preventing reflection of external light.

An organic light emitting display apparatus implemented not to include a polarizing plate according to an embodiment of the present disclosure comprises a substrate on which a plurality of sub-pixels are disposed, a plurality of organic light emitting elements disposed on the substrate to correspond to the plurality of sub-pixels, respectively, and a plurality of light extraction patterns disposed to have different aspect ratios in each of the plurality of sub-pixels, the plurality of sub-pixels include a green sub-pixel, a red sub-pixel and a blue sub-pixel, each of the plurality of organic light emitting elements include a first electrode, a first light emitting part disposed on the first electrode and including a blue light emitting layer, a second light emitting part disposed on the first light emitting part and including a red light emitting layer and two yellow-green light emitting layers, a third light emitting part disposed on the second light emitting part and including a blue light emitting layer, and a second electrode disposed on the third light emitting part.

According to some embodiments of the present disclosure, an aspect ratio of the plurality of light extraction patterns can be highest in the green sub-pixel among the plurality of sub-pixels.

According to some embodiments of the present disclosure, an aspect ratio of the plurality of light extraction patterns can be lowest in the red sub-pixel among the plurality of sub-pixels.

According to some embodiments of the present disclosure, a thickness between an upper surface of the first electrode and a lower surface of the blue light emitting layer of the first light emitting part can be 220 Å to 620 Å, a thickness between the upper surface of the first electrode and a lower surface of the red light emitting layer or the yellow-green light emitting layer of the second light emitting part can be 1740 Å to 2140 Å, and a thickness between the upper surface of the first electrode and a lower surface of the blue light emitting layer of the third light emitting part can be 2730 Å to 3130 Å.

According to some embodiments of the present disclosure, the organic light emitting display apparatus can further include an encapsulation part disposed on the plurality of organic light emitting elements; a plurality of color filters contacting an upper surface of the encapsulation part and disposed to correspond to the plurality of sub-pixels; and a planarization layer disposed to surround the plurality of color filters, wherein the plurality of light extraction patterns are disposed to contact an upper surface of the planarization layer.

According to some embodiments of the present disclosure, the organic light emitting display apparatus can be driven in dark conditions (e.g., in dark rooms/areas/environments), and can be implemented in a cinema screen or a virtual reality (VR) device.

It will be apparent to those skilled in the art that various modifications and variations can be made in the present disclosure without departing from the technical idea or scope of the disclosure. Thus, it can be intended that embodiments of the present disclosure cover the modifications and variations of the disclosure provided they come within the scope of the appended claims and their equivalents.

What is claimed is:

1. An organic light emitting display apparatus, comprising:
    a substrate including a plurality of pixels having a plurality of sub-pixels;
    a plurality of organic light emitting elements at the plurality of sub-pixels;
    a plurality of light extraction patterns on the plurality of organic light emitting elements and having different size at each of the plurality of sub-pixels;
    an encapsulation part on the plurality of organic light emitting elements; and
    a planarization layer configured to planarize an upper portion of the encapsulation part,
    wherein the plurality of light extraction patterns are on the planarization layer.

2. The organic light emitting display apparatus of claim 1, wherein the encapsulation part includes a first encapsulation layer, a foreign material covering layer, and a second encapsulation layer.

3. The organic light emitting display apparatus of claim 1, the plurality of organic light emitting elements includes at least two light emitting parts disposed on a first electrode.

4. The organic light emitting display apparatus of claim 1, wherein the plurality of light extraction patterns have different shapes at each of the plurality of sub-pixels in a vertical cross-section of the organic light emitting display apparatus.

5. The organic light emitting display apparatus of claim 1, wherein the plurality of light extraction patterns have different three-dimensional (3D) shapes.

6. The organic light emitting display apparatus of claim 1, wherein each of the plurality of organic light emitting elements includes a white light emitting part, and
    the white light emitting part includes a first light emitting part, a second light emitting part, and a third light emitting part.

7. The organic light emitting display apparatus of claim 6, wherein the first light emitting part and the third light emitting part include a blue light emitting layer, and
    the second light emitting part includes a red light emitting layer and two yellow-green light emitting layers.

8. The organic light emitting display apparatus of claim 7, wherein each of the plurality of organic light emitting elements further includes a first electrode under the first light emitting part,
    a thickness between an upper surface of the first electrode and a lower surface of the blue light emitting layer of the first light emitting part is approximately 220 Å to 620 Å,
    a thickness between the upper surface of the first electrode and a lower surface of the red light emitting layer or the yellow-green light emitting layer of the second light emitting part is approximately 1740 Å to 2140 Å, and
    a thickness between the upper surface of the first electrode and a lower surface of the blue light emitting layer of the third light emitting part is approximately 2730 Å to 3130 Å.

9. The organic light emitting display apparatus of claim 8, wherein the plurality of sub-pixels includes a red sub-pixel, a green sub-pixel and a blue sub-pixel, and
    the plurality of light extraction patterns have different aspect ratios in the red sub-pixel, the green sub-pixel, and the blue sub-pixel.

10. The organic light emitting display apparatus of claim 9, wherein among the plurality of light extraction patterns, the aspect ratio of the light extraction pattern in the blue sub-pixel is less than the aspect ratio of the light extraction pattern in the green sub-pixel and is greater than the aspect ratio of the light extraction pattern in the red sub-pixel.

11. The organic light emitting display apparatus of claim 10, wherein the aspect ratio of the light extraction pattern in the green sub-pixel is approximately 1.2, the aspect ratio of the light extraction pattern in the blue sub-pixel is approximately 1.1, and the aspect ratio of the light extraction pattern in the red sub-pixel is approximately 1.0.

12. The organic light emitting display apparatus of claim 1, wherein the plurality of light extraction patterns directly contact the planarization layer.

13. The organic light emitting display apparatus of claim 1, wherein the plurality of light extraction patterns overlap a plurality of color filters.

14. The organic light emitting display apparatus of claim 1, wherein the organic light emitting display apparatus does not include a polarizing plate for preventing reflection of external light.

15. An organic light emitting display apparatus implemented not to include a polarizing plate, the organic light emitting display apparatus comprising:
    a substrate on which a plurality of sub-pixels is disposed;
    a plurality of organic light emitting elements on the substrate to correspond to the plurality of sub-pixels, respectively; and
    a plurality of light extraction patterns disposed to have different width in each of the plurality of sub-pixels, wherein the plurality of sub-pixels includes a green sub-pixel, a red sub-pixel and a blue sub-pixel, and wherein each of the plurality of organic light emitting elements includes:

a first electrode;

a first light emitting part on the first electrode and including a blue light emitting layer;

a second light emitting part on the first light emitting part and including a red light emitting layer and two yellow-green light emitting layers;

a third light emitting part on the second light emitting part and including a blue light emitting layer; and a second electrode on the third light emitting part.

16. The organic light emitting display apparatus of claim 15, wherein an aspect ratio of the plurality of light extraction patterns is highest in the green sub-pixel among the plurality of sub-pixels.

17. The organic light emitting display apparatus of claim 16, wherein an aspect ratio of the plurality of light extraction patterns is lowest in the red sub-pixel among the plurality of sub-pixels.

18. The organic light emitting display apparatus of claim 15, wherein a thickness between an upper surface of the first electrode and a lower surface of the blue light emitting layer of the first light emitting part is approximately 220 Å to 620 Å, a thickness between the upper surface of the first electrode and a lower surface of the red light emitting layer or the yellow-green light emitting layer of the second light emitting part is approximately 1740 Å to 2140 Å, and a thickness between the upper surface of the first electrode and a lower surface of the blue light emitting layer of the third light emitting part is approximately 2730 Å to 3130 Å.

19. The organic light emitting display apparatus of claim 15, further comprising:

an encapsulation part on the plurality of organic light emitting elements;

a plurality of color filters contacting an upper surface of the encapsulation part and disposed to correspond to the plurality of sub-pixels; and a planarization layer disposed to surround the plurality of color filters, wherein the plurality of light extraction patterns is disposed to contact an upper surface of the planarization layer.

* * * * *